United States Patent [19]

Park

[11] Patent Number: 5,568,146

[45] Date of Patent: Oct. 22, 1996

[54] DIGITAL/ANALOG CONVERTER

[75] Inventor: Yong-In Park, Seoul, Rep. of Korea

[73] Assignee: Goldstar Electron Co., Ltd., Choongchungbook-Do, Rep. of Korea

[21] Appl. No.: 368,445

[22] Filed: Jan. 4, 1995

[30] Foreign Application Priority Data

May 17, 1994 [KR] Rep. of Korea .................. 10843/1994

[51] Int. Cl.$^6$ .............................. H03M 1/68; H03M 1/10
[52] U.S. Cl. ............................................ 341/145; 341/118
[58] Field of Search .................................. 341/118, 120, 341/136, 144, 145, 153, 154

[56] References Cited

U.S. PATENT DOCUMENTS

| 5,111,205 | 5/1992 | Morlon ................................... 341/145 |
| 5,243,347 | 9/1993 | Jackson et al. ......................... 341/144 |
| 5,283,580 | 2/1994 | Brooks et al. .......................... 341/145 |

Primary Examiner—Howard L. Williams
Attorney, Agent, or Firm—Lowe, Price, LeBlanc & Becker

[57] ABSTRACT

A digital/analog converter comprising a coarse bit decoder for decoding M higher-order bits of an (M+N)-bit input digital signal, a fine bit decoder for decoding N lower-order bits of the (M+N)-bit input digital signal, a current scaler for classifying currents into a plurality of steps and outputting a selected one of the classified step currents in response to an output signal from the coarse bit decoder, a current/voltage converter for converting an output current from the current scaler into a voltage, a voltage elevator for outputting an output voltage from the current/voltage converter as a reference voltage, a voltage divider for dividing the reference voltage from the voltage elevator into a plurality of steps and outputting a selected one of the divided step voltages in response to a switching control signal from the fine bit decoder, and a current compensator for compensating for an amount of current flowing through the voltage divider to make the reference voltage in the voltage divider constant in level.

11 Claims, 4 Drawing Sheets

5,568,146

DIGITAL/ANALOG CONVERTER

BACKGROUND OF THE INVENTION

1. Field of the Invention

The present invention relates in general to digital/analog converters, and more particularly to a digital/analog converter in which input digital data is divided into higher-order bits and lower-order bits and the divided higher and lower-order bits are processed by current and resistor array manners, respectively, so that a digital/analog conversion operation can be performed at a high speed and a high resolution, and an error resulting from a process deviation is automatically compensated by a current compensation circuit so that an integration degree of a semiconductor device can be enhanced.

2. Description of the Prior Art

Referring to FIG. 1, there is shown a circuit diagram of a conventional digital/analog converter. As shown in this drawing, the conventional digital/analog converter comprises a voltage divider 1 for dividing a difference between top and bottom reference voltages $V_{RT}$ and $V_{RB}$ into $2^N$ steps if the bits number of an input digital signal is N. To this end, the voltage divider 1 includes a string of $2^N$ resistors R1–R2$^N$ connected in series between the top and bottom reference voltages $V_{RT}$ and $V_{RB}$.

The conventional digital/analog converter also comprises a decoder 3 for decoding the N-bit input digital signal into a $2^N$-bit signal and outputting the decoded $2^N$-bit signal to a divided-voltage selector 2. The divided-voltage selector 2 is adapted to selectively output the voltages divided into the $2^N$ steps by the voltage divider 1 in response to the output signal from the decoder 3. To this end, the divided-voltage selector 2 includes $2^N$-1 electronic switches S1–S2$^N$-1.

Further, the conventional digital/analog converter comprises an output buffer 4 for buffering an output voltage from the divided-voltage selector 2 and outputting the buffered voltage.

The operation of the conventional digital/analog converter with the above-mentioned construction will hereinafter be described.

If the bits number of the input digital signal is N, in the voltage divider 1, the difference $V_{RT}$–$V_{RB}$ between the top and bottom reference voltages $V_{RT}$ and $V_{RB}$ is divided into the $2^N$ steps by the $2^N$ resistors R1–R2$^N$ connected in series therebetween. In this case, a voltage across each of the resistors R1–R2$^N$ is $(V_{RT}–V_{RB})/2^N$ [V].

Each of $2^N$-1 nodes is formed between adjacent ones of the resistors R1–R2$^N$ in the voltage divider 1 and connected to one terminal of a corresponding one of the $2^N$-1 electronic switches S1–S2$^N$-1 in the divided-voltage selector 2, the other terminals of which are connected in common to a non-inverting input terminal of an operational amplifier in the output buffer 4. The decoder 3 decodes the N-bit input digital signal into the $2^N$-bit signal and outputs the decoded $2^N$-bit signal as a switching control signal to the electronic switches S1–S2$^N$-1.

The electronic switches S1–S2$^N$-1 in the divided-voltage selector 2 are turned on/off in response to the $2^N$-bit signal from the decoder 3 to selectively output the voltages divided into the $2^N$ steps by the voltage divider 1. Then, the output buffer 4 amplifies the output voltage from the divided-voltage selector 2 by a desired level and outputs the amplified voltage.

However, the above-mentioned conventional digital/analog converter has a disadvantage in that the resistor string and the switch group are increased in size as a resolution of an output voltage Vo becomes higher, resulting in an increase in the chip size and consumption power. Also, when the resistor string has no matching, the resolution is reduced.

SUMMARY OF THE INVENTION

Therefore, the present invention has been made in view of the above problems, and it is an object of the present invention to provide a digital/analog converter in which input digital data is divided into higher-order bits and lower-order bits and the divided higher and lower-order bits are processed by current and resistor array manners, respectively, so that a digital/analog conversion operation can be performed at a high speed and a high resolution, and a reference voltage becomes always constant in level through an external resistor so that an error resulting from a process deviation can be compensated.

In accordance with the present invention, the above and other objects can be accomplished by a provision of a digital/analog converter comprising coarse bit decoding means for decoding M higher-order bits of an (M+N)-bit input digital signal; fine bit decoding means for decoding N lower-order bits of the (M+N)-bit input digital signal; current scaling means for classifying currents into a plurality of steps and outputting a selected one of the classified step currents in response to an output signal from said coarse bit decoding means; current/voltage conversion means for converting an output current from said current scaling means into a voltage; voltage elevating means for outputting an output voltage from said current/voltage conversion means as a reference voltage; voltage dividing means for dividing the reference voltage from said voltage elevating means into a plurality of steps and outputting a selected one of the divided step voltages in response to a switching control signal from said fine bit decoding means; and current compensation means for compensating for an amount of current flowing through said voltage dividing means to make the reference voltage in said voltage dividing means constant in level.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
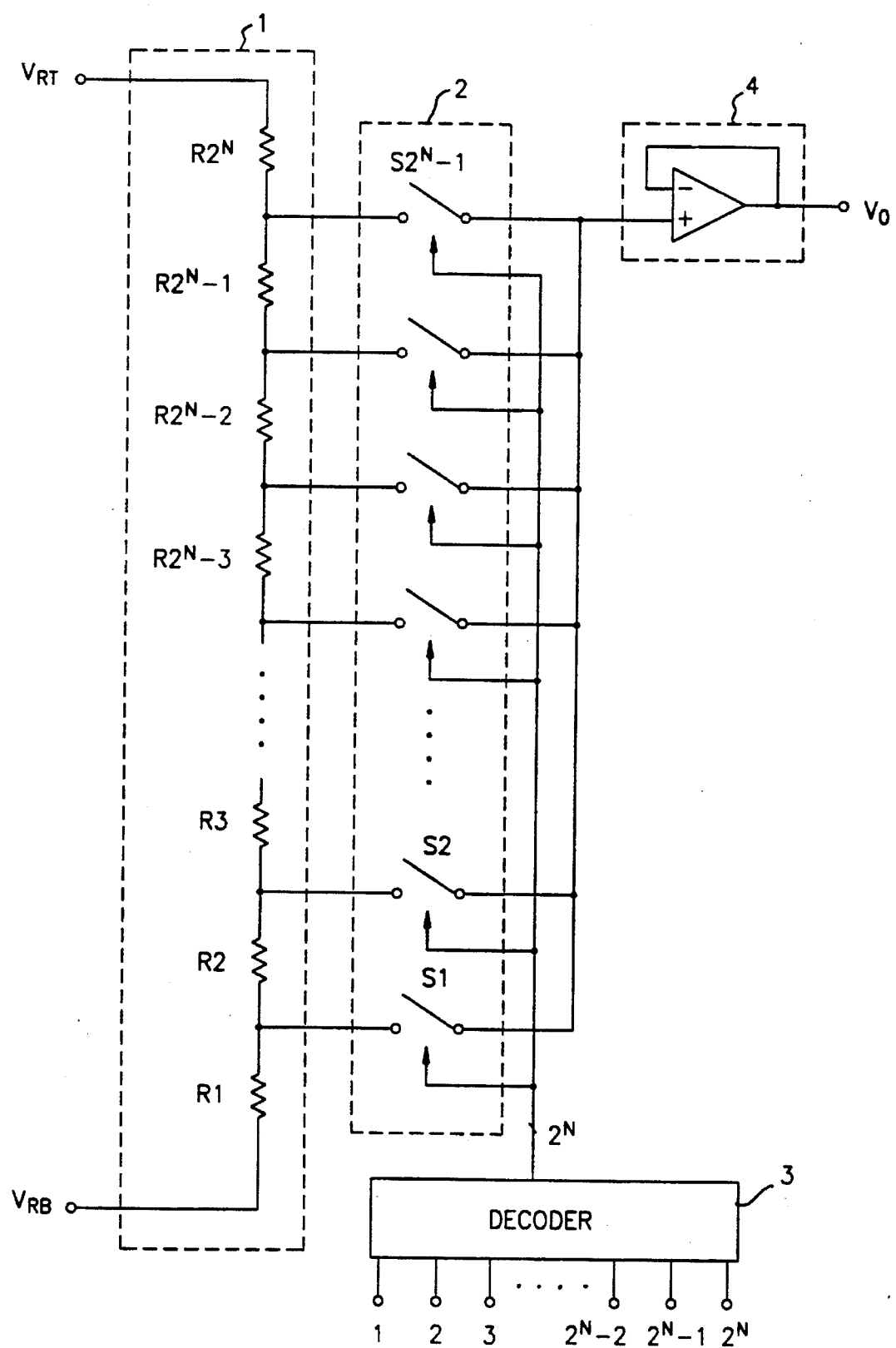
FIG. 1 is a circuit diagram of a conventional digital/analog converter.
Figure 2:
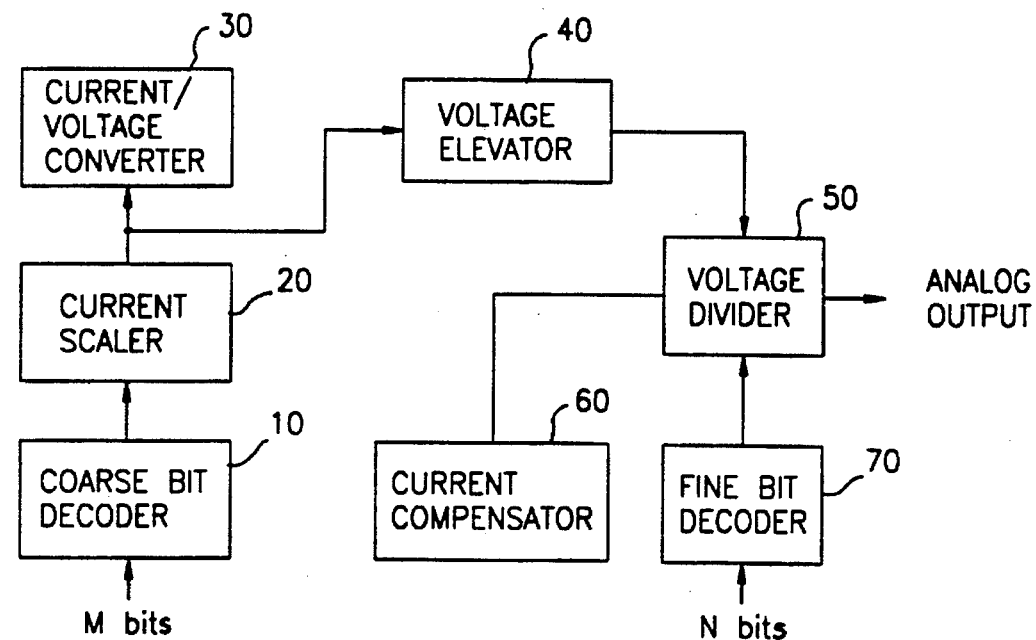
FIG. 2 is a block diagram of a digital/analog converter in accordance with the present invention.

Referring to FIG. 2, there is shown a block diagram of a digital/analog converter in accordance with the present invention. As shown in this drawing, the digital/analog converter comprises a coarse bit decoder 10 for decoding M higher-order bits of a K(M+N)-bit input digital signal, a fine bit decoder 70 for decoding N lower-order bits of the K(M+N)-bit input digital signal, a current scaler 20 for classifying currents into $2^M$ steps and outputting a selected one of the classified $2^M$ step currents in response to an output signal from the coarse bit decoder 10, a current/voltage converter 30 for converting an output current from the current scaler 20 into a voltage, and a voltage elevator 40 for outputting an output voltage from the current/voltage converter 30 as a reference voltage to a voltage divider 50.

The voltage divider 50 is adapted to divide the reference voltage from the voltage elevator 40 into $2^N$ steps and output a selected one of the divided $2^N$ step voltages in response to a switching control signal from the fine bit decoder 70.

Further, the digital/analog converter comprises a current compensator 60 for compensating for an amount of current flowing through the voltage divider 50 to make the reference voltage in the voltage divider 50 constant in level.

The operation of the digital/analog converter with the above-mentioned construction in accordance with the present invention will hereinafter be described in detail.

First, the K(M+N)-bit input digital signal is divided into the M higher-order bits and the N lower-order bits. The divided M higher-order bits are decoded by the coarse bit decoder 10 and the divided N lower-order bits are decoded by the fine bit decoder 70. The output signal from the coarse bit decoder 10 is applied to the current scaler 20. The current scaler 20 classifies the currents into the $2^M$ steps and outputs a selected one of the classified $2^M$ step currents in response to the output signal from the coarse bit decoder 10.

Figure 3:
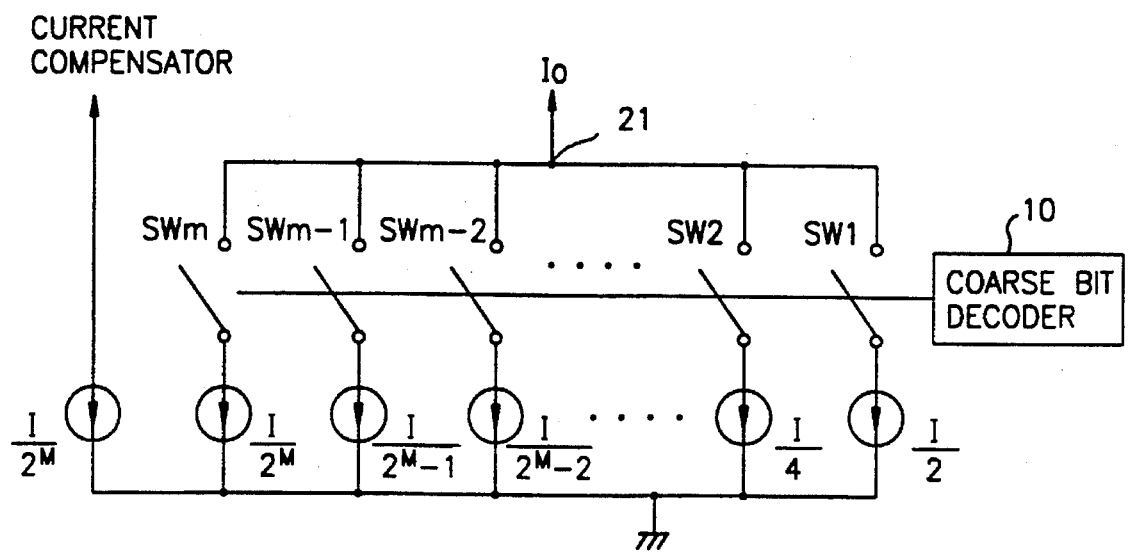
FIG. 3 is a circuit diagram of an embodiment of a current scaler in FIG. 2.

Referring to FIG. 3, there is shown a circuit diagram of an embodiment of the current scaler 20. As shown in this drawing, the current scaler 20 includes M current sources connected in parallel to one another. The M current sources have one terminals connected in common to a ground terminal and the other terminals connected in common to a node 21 connected to the current/voltage converter 30, respectively. The current scaler 20 also includes M switches SW1–SWM connected between the M current sources and the node 21, respectively. In the case where the input digital signal has M bits $D_M, D_{M-1}, \ldots, D_1$, M weights $I/2, I/2^2, \ldots, I/2^M$ are assigned to the current sources, respectively. One of the M switches SW1–SWM is turned on according to a data combination from the coarse bit decoder 10, so as to select the corresponding current source. As a result, the current from the selected current source is outputted through the node 21 to the current/voltage converter 30. Namely, the current scaler 20 outputs a selected one of the classified $2^M$ step currents in response to the output signal from the coarse bit decoder 10. At this time, the output current Io from the current scaler 20 can be expressed as follows:

$$Io = \frac{I}{2} D_M + \frac{I}{2^2} D_{M-1} + \ldots + \frac{I}{2^M} D_1$$

The output current Io from the current scaler 20 is converted into a voltage $V_{o1}$ by the current/voltage converter 30.

Figure 4:
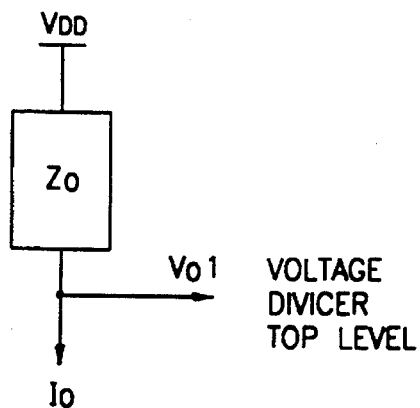
FIG. 4 is a circuit diagram of an embodiment of a current/voltage converter in FIG. 2.

Referring to FIG. 4, there is shown a circuit diagram of an embodiment of the current/voltage converter 30. As shown in this drawing, the current/voltage converter 30 includes an impedance Zo for connecting a supply voltage source $V_{DD}$ to the node 21 of the current scaler 20 therethrough. The voltage $V_{o1}$ is obtained by dropping a supply voltage from the supply voltage source $V_{DD}$ by a voltage obtained by multiplying the current Io from the current scaler 20 by the impedance Zo. Namely, the voltage $V_{o1}$ can be expressed as follows:

$$V_{o1} = V_{DD} - Zo Io$$

The voltage $V_{o1}$ from the current/voltage converter 30 is applied as the reference voltage to the voltage divider 50 by the voltage elevator 40.

Figure 5:
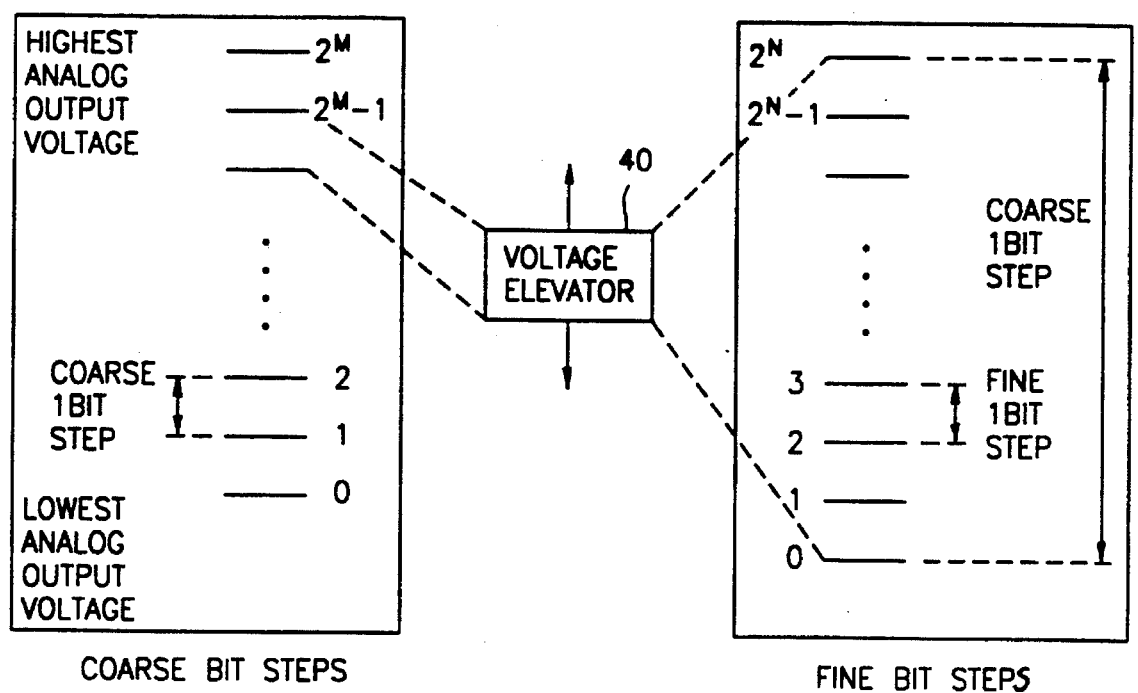
FIG. 5 is a view illustrating an embodiment of a voltage elevator in FIG. 2.

As shown in FIG. 5, the voltage elevator 40 outputs a coarse one bit step voltage from the current/voltage converter 30 as the reference voltage to the voltage divider 50. The coarse one bit step voltage is one of the voltages classified into the $2^M$ steps by the current scaler 20 and the current/voltage converter 30, selected by the coarse bit decoder 10.

Figure 6:
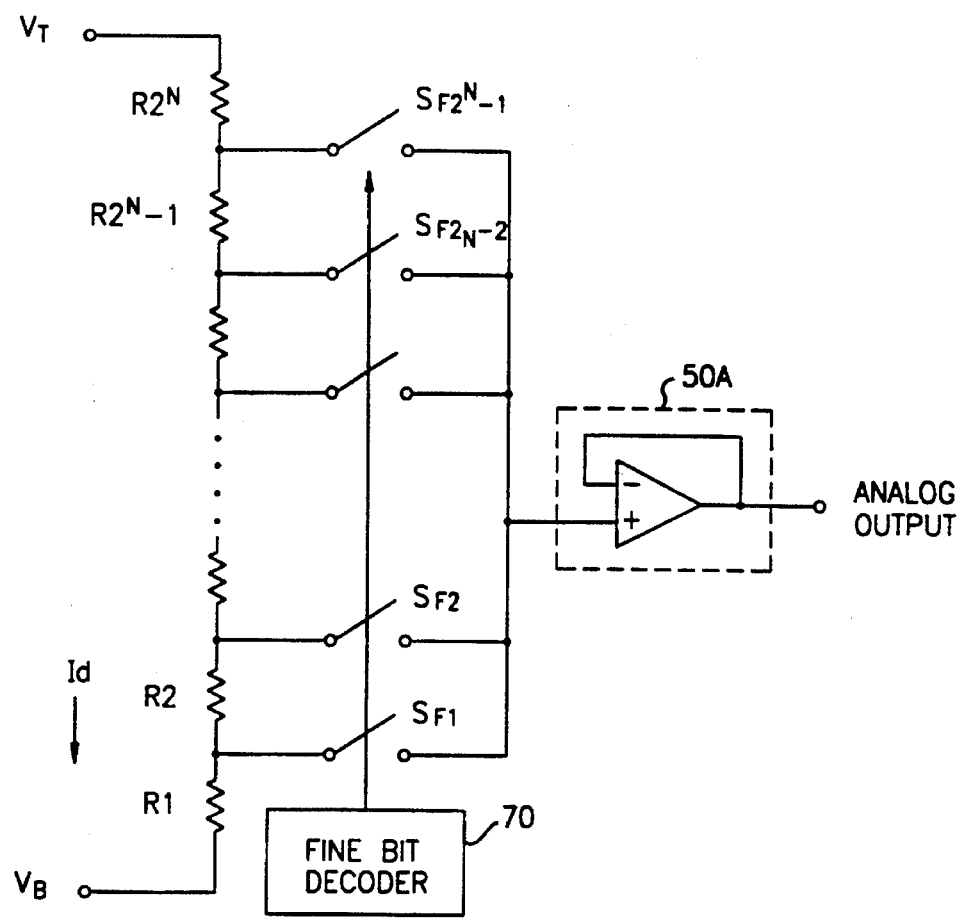
FIG. 6 is a circuit diagram of an embodiment of a voltage divider in FIG. 2.

Referring to FIG. 6, there is shown a circuit diagram of an embodiment of the voltage divider 50. As shown in this drawing, the voltage divider 50 includes $2^N$ resistors R1–R$2^N$ connected in series between top and bottom reference voltages $V_T$ and $V_B$ to divide equally the difference therebetween into the $2^N$ steps. The resistors R1–R$2^N$ have the same resistance. The relationship among the resistors R1–R$2^N$ can be given as follows:

$$R1 = R2 = \ldots = R2^N$$

$$R1 + R2 + \ldots + R2^N = R_{REF}$$

The difference between the top and bottom reference voltages $V_T$ and $V_B$ is the coarse one bit step voltage from the voltage elevator 40. Namely, $$V_T - V_B = V_{op-p}/2^M$$

where, $V_{op-p}$: full scale.

As a result, the coarse one bit step voltage from the voltage elevator 40 is equally divided into the $2^N$ steps by the resistors R1–R$2^N$. Here, the resistance $R_{REF}$ is the same as that in the current compensator 60 of FIG. 7.

The voltage divider 50 also includes $2^N-1$ switches SF1–SF$2^N$-1 having one terminals connected to respective nodes between adjacent ones of the resistors R1–R$2^N$ and the other terminals connected in common to a non-inverting input terminal of an operational amplifier in an output buffer 50A. The switching of the switches SF1–SF$2^N$-1 is controlled by the output signal from the fine bit decoder 70 which decodes the N lower-order bits of the K(M+N)-bit input digital signal.

In result, the output voltages from the switches SF1–SF$2^N$-1 are obtained by dividing again the voltages classified into the $2^M$ coarse bit steps into the $2^N$ fine bit steps. In this manner, the K(M+N)-bit input digital signal is converted into an analog voltage signal. Then, the digital/analog-converted signal is applied to the non-inverting input terminal of the operational amplifier in the output buffer 50A. As a result, the output buffer 50A amplifies the digital/analog-converted signal by a desired level and outputs the amplified signal.

By the way, the resistance $R_{REF}$ may not be always constant in implementing the voltage divider 50. Namely, the resistance $R_{REF}$ may be varied due to a process deviation as follows:

$$R'_{REF} = R_{REF} + \Delta R$$

For this reason, in the case where the voltage divider 50 is operated based on a constant amount of current, the coarse one bit step voltage may not be accurately outputted with a voltage error of $\Delta R \times \frac{1}{2}^M$.

Therefore, the current compensation is required to make the difference between the top and bottom reference voltages $V_T$ and $V_B$ equal to the coarse one bit step voltage although the resistance of the string of the resistors R1–R2$^N$ is varied due to the process deviation. To this end, the present invention provides the current compensator 60 of FIG. 7.

Figure 7:
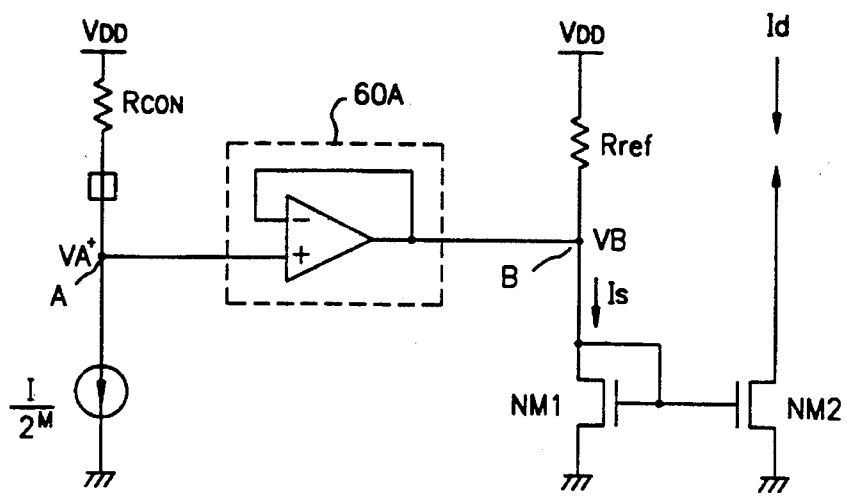
FIG. 7 is a circuit diagram of an embodiment of a current compensator in FIG. 2.

Referring to FIG. 7, there is shown a circuit diagram of an embodiment of the current compensator 60. As shown in this drawing, the current compensator 60 includes an external resistor $R_{CON}$ and a current source $I/2^M$ connected in series between the supply voltage source $V_{DD}$ and the ground terminal. The current source $I/2^M$ is the same as that in the current scaler 20 of FIG. 3, and is used for the current compensation. The current compensator 60 also includes an internal resistor $R_{REF}$ and an NMOS transistor NM1 connected in series between the supply voltage source $V_{DD}$ and the ground terminal. The NMOS transistor NM1 has a gate and a drain connected in common to the internal resistor $R_{REF}$ and a source connected to the ground terminal. Further, the current compensator 60 includes an output buffer 60A including an operational amplifier. The operational amplifier has a non-inverting input terminal connected to a node A between the external resistor $R_{CON}$ and the current source $I/2^M$ and an output terminal connected to a node B between the internal resistor $R_{REF}$ and the NMOS transistor NM1. Further, the current compensator 60 includes an NMOS transistor NM2 having a gate connected to the gate of the NMOS transistor NM1, a source connected to the ground terminal and a drain for inputting the bottom reference voltage $V_B$ from the voltage divider 50.

Because the current $I/2^M$ flows from the supply voltage source $V_{DD}$ through the external resistor $R_{CON}$, a voltage $V_A$ at the node A is given as follows:

$$V_A = V_{DD} - (R_{CON} \times I/2^M)$$

In the above equation, adjusting a resistance of the external resistor $R_{CON}$ so that a voltage of $V_{DD}-V_A$ can become the coarse one bit step voltage, the result is:

$$R_{CON} \times I/2^M = \text{coarse one bit step voltage}$$

As a result, the coarse one bit step voltage can always be constant in level. The voltage $V_A$ at the node A is transferred through the output buffer 60A to the node B. In result, a voltage $V_B$ at the node B becomes equal to the voltage $V_A$ at the node A.

A current Is flowing through the NMOS transistor NM1 is given as follows:

$$\begin{aligned} Is &= (V_{DD} - V_B)/R_{REF} \\ &= (V_{DD} - V_A)/R_{REF} \\ &= (R_{CON}/R_{REF}) \times (I/2^M) \end{aligned}$$

Here, a resistance of the resistor $R_{REF}$ is equal to the sum of the resistances of the resistors R1–R2$^N$ in the voltage divider 50 of FIG. 6, as mentioned above.

On the other hand, a voltage drop $\Delta V$ resulting from the resistors R1–R2$^N$ in the voltage divider 50 of FIG. 6 can be expressed as follows:

$$\begin{aligned} \Delta V &= Id \times (R1 + R2 + \ldots + R2^N) \\ &= Is\,(=Id) \times R_{REF} \\ &= [(R_{CON}/R_{REF}) \times (I/2^M)] \times R_{REF} \\ &= R_{CON} \times I/2^M \end{aligned}$$

From the above equation, it can be seen that the voltage drop $\Delta V$ between the top and bottom reference voltages $V_T$ and $V_B$ in the voltage divider 60 can be accurately controlled by the external resistor $R_{CON}$ and the current source $I/2^M$. Therefore, the reference voltage can become constant in level regardless of the variation in the resistance due to the process deviation.

As apparent from the above description, according to the present invention, the reference voltage being supplied to the voltage divider is always constant in level. Therefore, the digital/analog converter of the present invention has the effect of removing an error of the output signal due to a process deviation of an integrated device. Also, in the case where the input digital data is 16 bits, the digital/analog converter of the present invention requires $2^8$ resistors, although the conventional digital/analog converter employing the resistor string manner has required $2^{16}$ resistors. Therefore, the digital/analog converter of the present invention has the effect of reducing the chip size. Further, because the 8 high-order bits of the input digital signal are processed in the current drive manner, the digital/analog conversion operation can be performed at a relatively high speed as compared with the conventional resistor string manner. Moreover, because the current is automatically compensated by the current compensator, a trimming procedure of the integrated device can be omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital/analog converter comprising:

coarse bit decoding means for decoding M higher-order bits of an (M+N)-bit input digital signal;

fine bit decoding means for decoding N lower order bits of the (M+N)-bit input digital signal;

current scaling means for classifying currents into a plurality of steps and outputting a selected one of the classified step currents in response to an output signal from said coarse bit decoding means;

current/voltage conversion means for converting an output current from said current scaling means into a voltage;

voltage elevating means for outputting an output voltage from said current/voltage conversion means as a reference voltage;

voltage dividing means for dividing the reference voltage from said voltage elevating means into a plurality of steps and outputting a selected one of the divided step voltages in response to a switching control signal from said fine bit decoding means; and current compensation means for compensating for an amount of current flowing through said voltage dividing means to make the reference voltage in said voltage dividing means constant in level.

2. A digital/analog converter as set forth in claim 1, wherein said current scaling means includes:

M current sources connected in parallel to one another, said M current sources having one terminals connected in common to a ground terminal and the other terminals connected in common to an output terminal connected to said current/voltage conversion means, respectively, said M current sources having different weights, respectively; and M switches connected between said M current sources and said output terminal, respectively.

3. A digital/analog converter as set forth in claim 1, wherein said current scaling means is adapted to classify the currents into $2^M$ steps and output a coarse one bit step current, said coarse one bit step current being one of the classified $2^M$ step currents selected by said coarse bit decoding means.

4. A digital/analog converter as set forth in claim 2, wherein said current scaling means further includes a current source for current compensation.

5. A digital/analog converter as set forth in claim 4, wherein said current source for current compensation has the same weight as that of a least significant bit one of said M current sources.

6. A digital/analog converter as set forth in claim 1, wherein said current/voltage conversion means includes an impedance for connecting a supply voltage source to an output terminal of said current scaling means therethrough; and a voltage output terminal formed between said impedance and said output terminal of said current scaling means.

7. A digital/analog converter as set forth in claim 1, wherein said voltage elevating means is adapted to output a coarse one bit step voltage from said current/voltage conversion means as the reference voltage to said voltage dividing means.

8. A digital/analog converter as set forth in claim 1, wherein said voltage dividing means includes:

$2^N$ resistors connected in series to one another to divide equally the reference voltage from said voltage elevating means into $2^N$ steps according to a least significant bit current from said current scaling means;

$2^N$-1 switches having one terminals connected to respective nodes between adjacent ones of said $2^N$ resistors and the other terminals connected in common to selectively output the voltages divided by said $2^N$ resistors in response to the switching control signal from said fine bit decoding means; and an output buffer for buffering an output voltage from each of said $2^N$-1 switches and outputting the buffered voltage.

9. A digital/analog converter as set forth in claim 1, wherein said current compensation means includes:

an external resistor and a current source for current compensation connected in series between a supply voltage source and a ground terminal;

an internal resistor and a first NMOS transistor connected in series between said supply voltage source and said ground terminal, said first NMOS transistor having a gate and a drain connected in common to said internal resistor and a source connected to said ground terminal;

an output buffer having an input terminal connected to a node between said external resistor and said current source and an output terminal connected to a node between said internal resistor and said first NMOS transistor; and a second NMOS transistor having a gate connected to the gate of said first NMOS transistor, a source connected to said ground terminal and a drain connected to said voltage dividing means.

10. A digital/analog converter as set forth in claim 9, wherein said external resistor has an adjustable resistance to adjust the amount of current flowing through said voltage dividing means.

11. A digital/analog converter as set forth in claim 9, wherein said internal resistor has the same resistance as that of a resistor string of said voltage dividing means.

* * * * *